US012660166B2

(12) United States Patent
Park et al.

(10) Patent No.: US 12,660,166 B2
(45) Date of Patent: Jun. 16, 2026

(54) INTEGRATED CIRCUIT DEVICE

(71) Applicant: Samsung Electronics Co., Ltd.,
Suwon-si (KR)

(72) Inventors: Taejin Park, Suwon-si (KR); Bongsoo Kim, Suwon-si (KR); Huijung Kim, Suwon-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 226 days.

(21) Appl. No.: 18/464,475

(22) Filed: Sep. 11, 2023

(65) Prior Publication Data
US 2024/0130112 A1 Apr. 18, 2024

(30) Foreign Application Priority Data

Oct. 13, 2022 (KR) ........................ 10-2022-0131655

(51) Int. Cl.
*H10B 12/00* (2023.01)
(52) U.S. Cl.
CPC ........... *H10B 12/34* (2023.02); *H10B 12/053* (2023.02); *H10B 12/485* (2023.02); *H10B 12/488* (2023.02)
(58) Field of Classification Search
CPC .. H10B 12/0335; H10B 12/053; H10B 12/30; H10B 12/315; H10B 12/34; H10B 12/48; H10B 12/482; H10B 12/485; H10B 12/488
See application file for complete search history.

(56) References Cited

U.S. PATENT DOCUMENTS

| | | | |
|---|---|---|---|
| 9,214,382 B2 | 12/2015 | Lee et al. | |
| 9,627,387 B2 | 4/2017 | Jung et al. | |
| 10,522,362 B2 | 12/2019 | Kim et al. | |
| 11,282,787 B2 | 3/2022 | Park et al. | |
| 11,404,538 B2 | 8/2022 | Park et al. | |
| 11,468,919 B2 | 10/2022 | Park et al. | |
| 2015/0126013 A1 | 5/2015 | Hwang et al. | |

(Continued)

FOREIGN PATENT DOCUMENTS

| | | |
|---|---|---|
| KR | 10-2014-0078473 A | 6/2014 |
| KR | 10-2015-0096183 A | 8/2015 |

(Continued)

OTHER PUBLICATIONS

Taiwanese Office Action dated Jan. 7, 2026 issued in Taiwanese Patent Application No. 112136169.

(Continued)

*Primary Examiner* — Hoai V Pham
(74) *Attorney, Agent, or Firm* — Harness, Dickey & Pierce, P.L.C.

(57) ABSTRACT

Provided is an integrated circuit device including a substrate that has an active region defined by a plurality of device separation regions, a word line on the substrate and arranged in a word line trench that extends in a first horizontal direction, a bit line on the word line and extending in a second horizontal direction orthogonal to the first horizontal direction, a pad on the active region and having a horizontal width that is larger than the active region, and a bit line contact electrically connecting the bit line to the active region, wherein a level of a lowermost surface of the additional pad is at a same vertical level as a level of a lowermost surface of the bit line contact.

20 Claims, 17 Drawing Sheets

(56)                           References Cited

U.S. PATENT DOCUMENTS

| | | | |
|---|---|---|---|
| 2016/0197042 A1 | 7/2016 | Lee et al. | |
| 2021/0408004 A1 | 12/2021 | Lee et al. | |
| 2022/0115382 A1 | 4/2022 | Lee et al. | |
| 2022/0181326 A1 | 6/2022 | An et al. | |
| 2024/0179889 A1* | 5/2024 | Lu ..................... | H10B 12/0335 |

FOREIGN PATENT DOCUMENTS

| | | | |
|---|---|---|---|
| KR | 10-2016-0068067 A | 6/2016 | |
| KR | 10-2018-0131915 A | 12/2018 | |
| KR | 102059863 B1 | 12/2019 | |
| KR | 10-2021-0013799 A | 2/2021 | |
| KR | 10-2021-0032595 A | 3/2021 | |
| KR | 10-2021-0109700 A | 9/2021 | |
| KR | 10-2022-0006782 A | 1/2022 | |
| TW | 202205636 A | 2/2022 | |
| TW | 202221893 A | 6/2022 | |

OTHER PUBLICATIONS

Korean Office Action dated Mar. 17, 2026 issued in corresponding Korean Appln. No. 10-2022-0131655.
Taiwanese Office Action dated Apr. 14, 2026 issued in corresponding Taiwanese Patent Application No. 112136169.

* cited by examiner

II-II'

I-I'

II-II'

I-I'

II-II'

II-II'

II-II'

II-II'

II-II'

I-I'

II-II'

II-II'

INTEGRATED CIRCUIT DEVICE

CROSS-REFERENCE TO RELATED APPLICATION

This application is based on and claims priority under 35 U.S.C. § 119 to Korean Patent Application No. 10-2022-0131655, filed on Oct. 13, 2022, in the Korean Intellectual Property Office, the disclosure of which is incorporated by reference herein in its entirety.

BACKGROUND

Various example embodiments relate to an integrated circuit device, and more particularly, to an integrated circuit device including an additional pad that is arranged on an active region.

Electronic devices are becoming smaller and lighter in accordance with the rapid development of the electronics industry and the needs of users. Therefore, an integrated circuit device having a high degree of integration used in electronic devices is required or desired, and the design rules for the components of the integrated circuit device are being reduced. Accordingly, the difficulty of a manufacturing process for increasing an insulation effect between conductive patterns constituting an integrated circuit device is gradually increasing.

SUMMARY

Various example embodiments provide an integrated circuit device that may increase the insulation effect between multiple active regions and/or between multiple word lines, by substantially equalizing the vertical level of the bottom surface of a direct contact and the vertical level of the bottom surface of a pad (an additional pad).

At least some problems to be solved or to be partially mitigated are not limited to the above-mentioned task, and other tasks not mentioned may be clearly understood by those of ordinary skill in the art from the following description.

According to some example embodiments, there is provided an integrated circuit device including a substrate including an active region defined by a plurality of device separation regions, a word line on the substrate and arranged in a word line trench extending in a first horizontal direction, a bit line on the word line and extending in a second horizontal direction orthogonal to the first horizontal direction, a pad on the active region and having a horizontal width larger than the active region, and a bit line contact electrically connecting the bit line to the active region, wherein a lowermost surface of the additional pad is a same level as a lowermost surface of the bit line contact.

Alternatively or additionally according to some example embodiments, there is provided an integrated circuit device including a substrate including an active region defined by a plurality of device separation regions, a word line on the substrate and arranged in a word line trench extending in a first horizontal direction, a bit line on the word line and extending in a second horizontal direction orthogonal to the first horizontal direction, a pad on the active region and having a horizontal width larger than the active region, a bit line contact electrically connecting the bit line to the active region, and a buried insulating layer on the word line and in the word line trench, wherein a distance between a lowermost surface of the buried insulating layer and a lowermost surface of the additional pad is the same as a distance between the lowermost surface of the buried insulating layer and a lowermost surface of the direct contact.

Alternatively or additionally according to some example embodiments, there is provided an integrated circuit device including a substrate including an active region defined by a plurality of device isolation regions, a word line on the substrate and arranged in a word line trench extending in a first horizontal direction, a bit line on the word line and extending in a second horizontal direction orthogonal to the first horizontal direction, a pad of a monolayer structure including doped polysilicon, which is on the active region and has a horizontal width larger than the active region, and a bit line contact electrically connecting the bit line to the active region, wherein at least a portion of an upper surface of the active region contacts the device isolation regions, the lowermost surface of the pad is at a same vertical level as the lowermost surface of the bit line contact and as an uppermost surface of the active region, and at least a portion of one sidewall in the pad has a rounded shape, and another sidewall facing the one sidewall in the pad has a vertical shape.

BRIEF DESCRIPTION OF THE DRAWINGS

Various example embodiments will be more clearly understood from the following detailed description taken in conjunction with the accompanying drawings in which.

DETAILED DESCRIPTION OF VARIOUS EXAMPLE EMBODIMENTS

Hereinafter, various example embodiments will be described in detail with reference to the accompanying drawings. However, this inventive concept does not have to be configured as limited to the embodiments described below, and may be embodied in various other forms. The following example embodiments are provided to sufficiently convey the scope of inventive concepts to those skilled in the art rather than being provided to enable inventive concepts to be complete.

Figure 1:
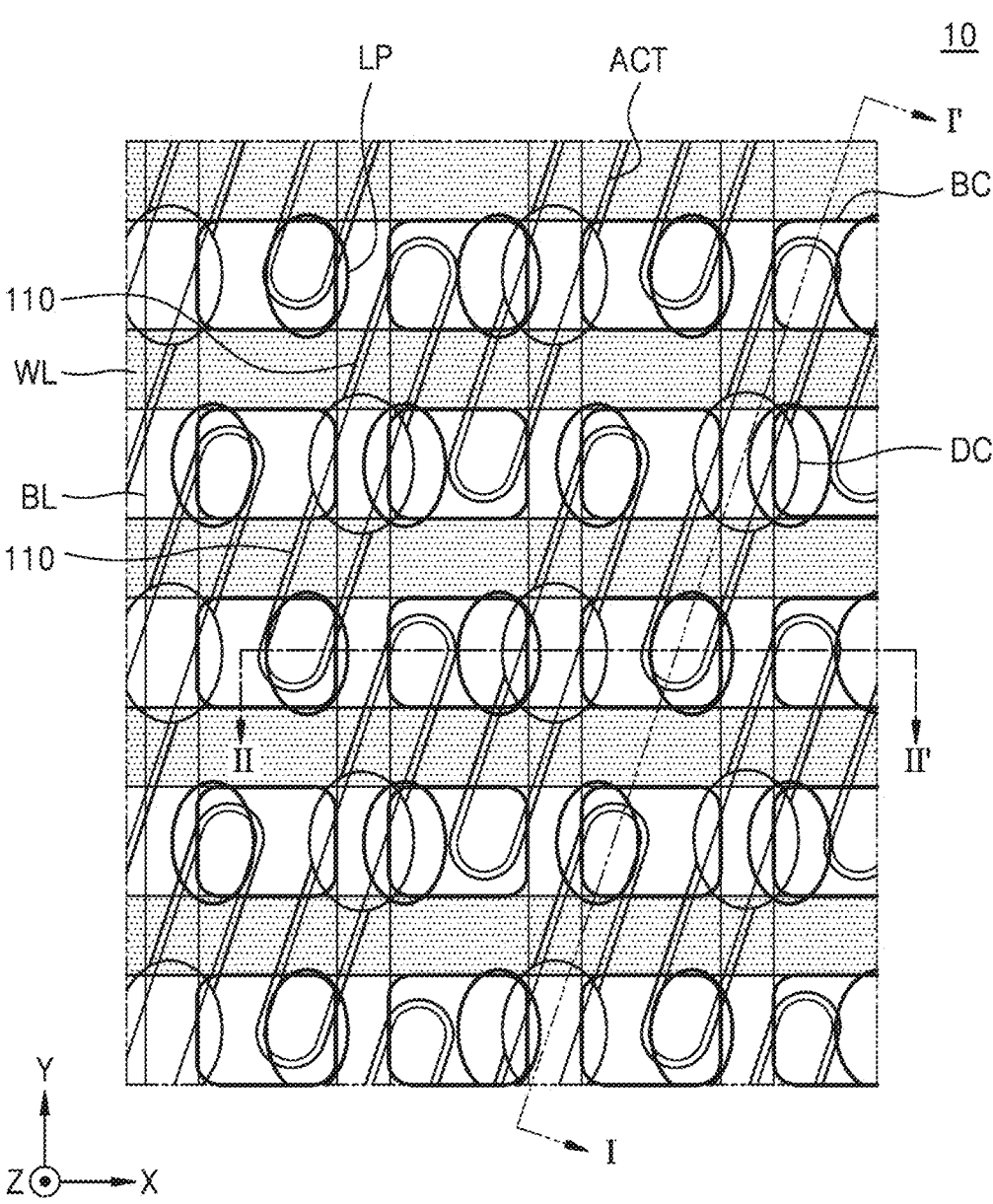
FIG. 1 is a layout diagram illustrating main components of an integrated circuit device according to some example embodiments.

Referring to FIG. 1, an integrated circuit device 10 may include a plurality of active regions ACT arranged to have a long axis in a diagonal direction with respect to a first horizontal direction (X direction) and a second horizontal direction (Y direction). The first horizontal direction may be orthogonal with the second horizontal direction.

A plurality of word lines WL may extend in parallel with each other in the first horizontal direction (X direction) across the plurality of active regions ACT. A plurality of digit lines or bit lines BL may extend on the plurality of word lines WL in parallel with each other in the second horizontal direction (Y direction) crossing the first horizontal direction (X direction).

The plurality of bit lines BL may be connected to a plurality of active regions ACT through digit line contacts or bit line contacts or direct contacts DC. In some example embodiments, a plurality of buried contacts BC may be formed between two adjacent bit lines BL from among the plurality of bit lines BL. The plurality of buried contacts BC may extend to an upper portion of one of two mutually adjacent bit lines BL. In some example embodiments, the plurality of buried contacts BC may be arranged in a line in the first horizontal direction (X direction) and the second horizontal direction (Y direction).

A plurality of landing pads LP may be formed on the plurality of buried contacts BC. The plurality of buried contacts BC and the plurality of landing pads LP may connect lower electrodes (not shown) of capacitors and/or memristors formed on the upper portions of the plurality of bit lines BL to the plurality of active regions ACT. The plurality of landing pads LP may be arranged to partially overlap the plurality of buried contacts BC, respectively. Hereinbelow, some example embodiments will be described in detail.

Figure 2:
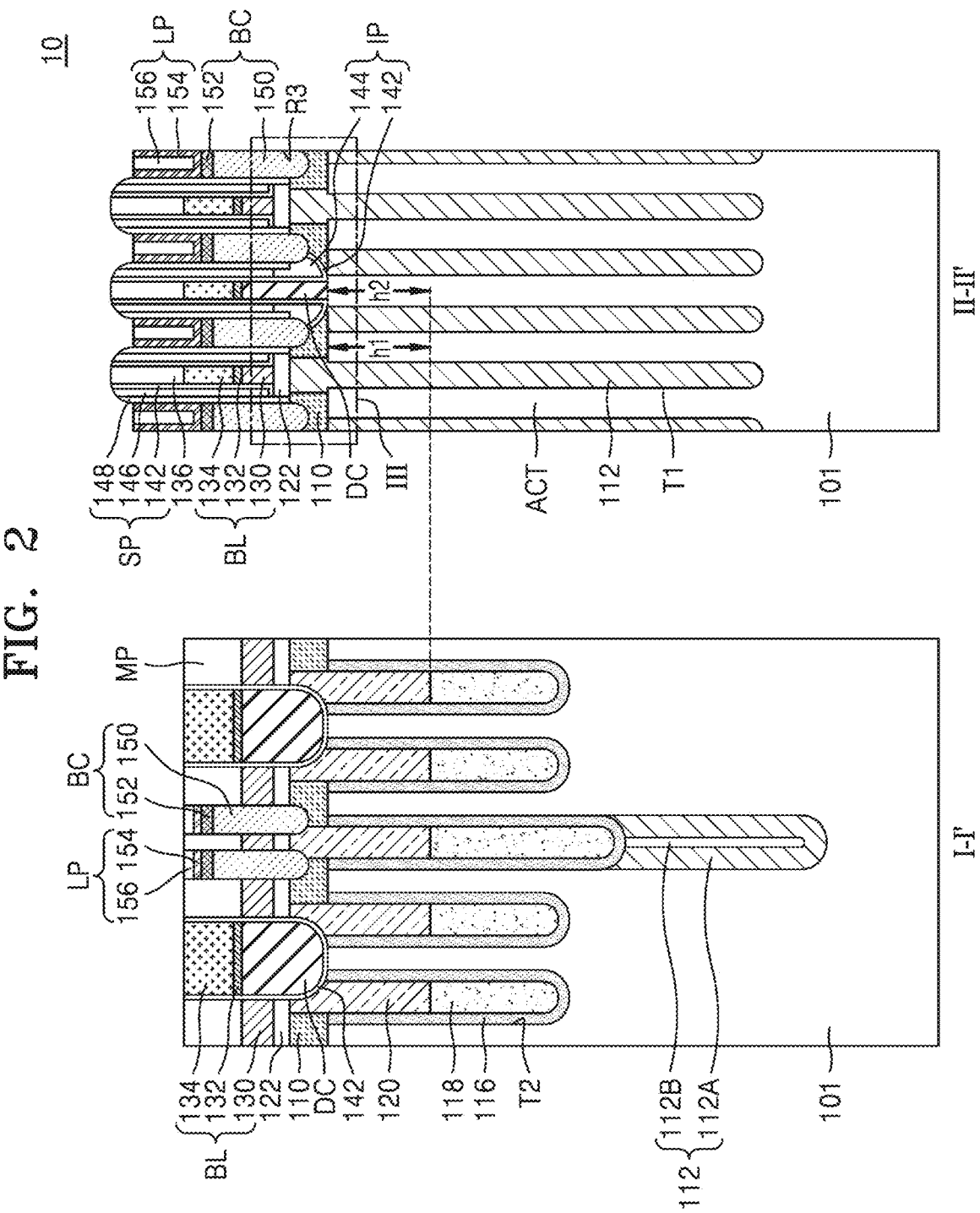
FIG. 2 illustrates a cross-sectional view taken along line I-I' and a cross-sectional view taken along line II-II' of an integrated circuit device according to some example embodiments.
Figure 3:
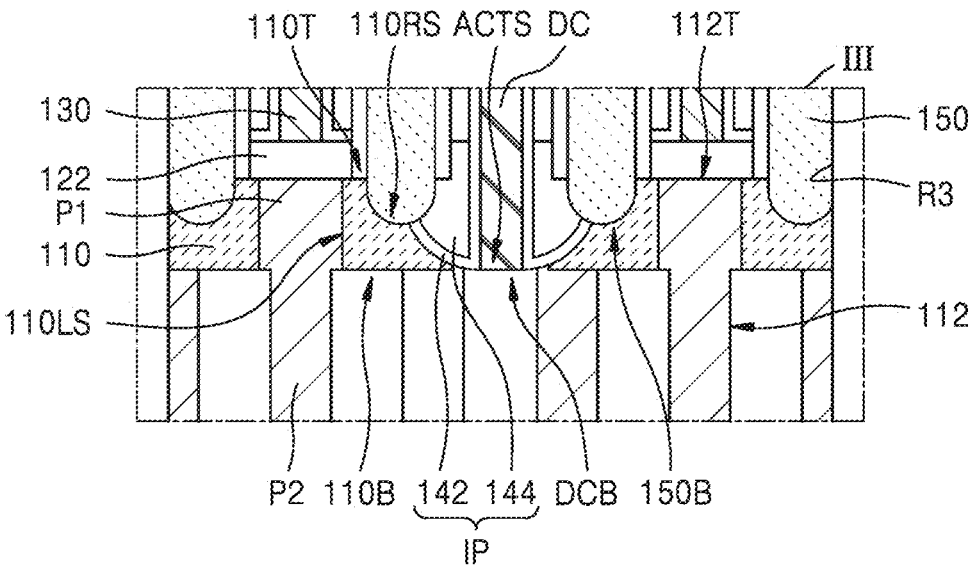
FIG. 3 is an enlarged view of portion III of FIG. 2.

FIG. 2 illustrates a cross-sectional view taken along line I-I' and a cross-sectional view taken along line II-II' of an integrated circuit device according to some example embodiments, and FIG. 3 is an enlarged view of portion III of FIG. 2.

Specifically, FIG. 2 is a cross-sectional view taken along a position corresponding to the line II-II' of FIG. 1.

Referring to FIGS. 2 and 3, the integrated circuit device 10 may include a substrate 101 having a plurality of active regions ACT defined by device separators 112.

The substrate 101 may be or may include a wafer including silicon (Si), or may be or may include a chip that is diced or separated/singulated from a wafer. Alternatively, the substrate 101 may be or may include a semiconductor element such as germanium (Ge), or may be or may include a chip or a wafer including a compound semiconductor such as silicon carbide (SiC), gallium arsenide (GaAs), indium arsenide (InAs), and indium phosphide (InP). Meanwhile, the substrate 101 may have a silicon on insulator (SOI) structure. In some example embodiments, the substrate 101 may include a conductive region, for example, an impurity-doped well and/or an impurity-doped structure.

A device separation region or device separator 112 may be formed in a first trench T1 formed in the substrate 101. The device separator 112 may be formed of silicon oxide, silicon nitride, or a combination thereof. In some example embodiments, the device separator 112 may be a shallow trench isolation (STI) region; however, example embodiments are not limited thereto. In some example embodiments, the device separator 112 may be a spin-on glass (SOG) region; however, example embodiments are not limited thereto The plurality of active regions ACT may be defined by the device separators 112 in the substrate 101.

The plurality of active regions ACT may be arranged in a bar shape extending in a diagonal direction with respect to the first horizontal direction (X direction) and the second horizontal direction (Y direction). In addition to the landing pad LP, a pad such as an additional pad 110 having a horizontal width that is greater than that of the active region ACT may be arranged on each of the plurality of active regions ACT. Details of this will be described later.

A plurality of word lines WL described above with reference to FIG. 1 may be embedded or buried in the substrate 101. A buffer layer 122 may be formed on the substrate 101. The buffer layer 122 may cover an upper surface of the additional pad 110 and an upper surface of the device separator 112. The buffer layer 122 may have a stacked structure of a first silicon oxide, a silicon nitride, and a second silicon oxide sequentially formed on the substrate 101, but is not limited thereto.

A plurality of bit lines BL extending parallel to each other in the second horizontal direction (Y direction) may be arranged on the buffer layer 122. The plurality of bit lines BL may be spaced apart from each other in the first horizontal direction (X direction). A direct contact DC may be arranged on all or at least a partial area of each of a plurality of active regions ACT. Each of the plurality of bit lines BL may be connected to the active region ACT through the direct contact DC. The direct contact DC may be formed of, for example, W, WN, Co, Ni, Al, Mo, Ru, Ti, TiN, Ta, TaN, Cu, or a combination thereof. In some example embodiments, the direct contact DC may be made of or may include doped polysilicon.

Each of the plurality of bit lines BLs may include a lower conductive layer 130, an intermediate conductive layer 132, and an upper conductive layer 134 sequentially formed on the substrate 101. An upper surface of each of the plurality of bit lines BL may be covered with an insulating capping pattern 136. The insulating capping pattern 136 may be arranged on the upper conductive layer 134. An upper surface of the lower conductive layer 130 of the bit line BL and an upper surface of the direct contact DC may be arranged on the same plane.

In some example embodiments, the lower conductive layer 130 may be formed of doped polysilicon. The intermediate conductive layer 132 and the upper conductive layer 134 may be formed of a layer including Ti, TiN, TiSiN, W, WN, WSi, WSiN, Ru, or a combination thereof. For example, the intermediate conductive layer 132 may be made of TiN and/or TiSiN layers, and the upper conductive layer 134 may be made of a layer including Ti, TiN, W, WN, WSiN, Ru, or a combination thereof. The insulating capping pattern 136 may be made of silicon nitride.

A plurality of recess spaces R3 may be formed in the active region ACT in a partial region of the substrate 101. The plurality of recess spaces R3 may be respectively filled with a plurality of contact plugs 150. Each of the plurality of contact plugs 150 may have a pillar shape extending in a vertical direction (Z direction) from the recess space R3. Each of the plurality of contact plugs 150 may be in contact with the active region ACT. The lower end portion of each of the plurality of contact plugs 150 may be arranged at a lower level than the upper surface of the substrate 101 so as to be embedded in the substrate 101. The plurality of contact plugs 150 may be formed of a metal layer entirely, or a metal and/or a metal silicide layer, and/or doped polysilicon, but is not limited thereto.

In the integrated circuit device 10, one direct contact DC and a pair of contact plugs 150 facing each other with the one direct contact DC therebetween may be electrically connected to different active regions ACT among the plurality of active regions ACT through additional pads 110, respectively. For example, the contact plug 150 may form a contact surface with the additional pad 110 having a larger horizontal width than the active region ACT, and may be directly connected thereto.

The plurality of contact plugs 150 may be arranged in a line in the second horizontal direction (Y direction) between a pair of bit lines BL selected from among the plurality of bit lines BL and adjacent to each other. Insulating fences (not shown) may be respectively arranged between the plurality of contact plugs 150 arranged in a line in the second horizontal direction (Y direction). The plurality of contact plugs 150 may be insulated from each other by the insulating fence. For example, the insulating fences may be made of or include silicon nitride. The insulating fences may have a pillar shape extending in a vertical direction (Z direction) on the substrate 101.

A plurality of metal silicide layers 152 and a plurality of landing pads LP may be respectively arranged on the plurality of contact plugs 150. Each of the plurality of landing pads LP may extend on the contact plug 150 along in a vertical direction (Z direction). Each of the plurality of landing pads LP may be electrically connected to each of the plurality of contact plugs 150 through the metal silicide layer 152.

Each of the plurality of landing pads LP may include a conductive barrier layer 154 and a metal layer 156. In some example embodiments, the conductive barrier layer 154 may be made of Ti, TiN, or a combination thereof, and the metal layer 156 may be made of tungsten (W). In a plan view, the plurality of landing pads LP may have a plurality of island pattern shapes. In some example embodiments, the metal silicide layer 152 may be composed of cobalt silicide, nickel silicide, and/or manganese silicide, but is not limited thereto. In some example embodiments, the metal silicide layer 152 may be omitted.

The contact plug 150 and the metal silicide layer 152 may constitute or be included in a buried contact BC. The contact plug 150, the metal silicide layer 152, and the landing pad LP arranged sequentially on the substrate 101 may form a contact structure electrically connected to the active region ACT through the additional pad 110 at a position adjacent to the bit line BL in the first horizontal direction (X direction).

Both sidewalls of each of the plurality of bit lines BL and the plurality of insulating capping patterns 136 covering an upper surface thereof may be covered with a spacer structure SP. A spacer structure SP may be placed between one bit line BL selected from the plurality of bit lines BL and the plurality of contact plugs 150 arranged in a line in the second horizontal direction (Y direction) at a position adjacent to the one bit line BL. Each of the plurality of spacer structures SP may include an inner spacer 142, an intermediate spacer 146, and an outer spacer 148.

The inner spacer 142 may be in contact with a sidewall of the bit line BL and a sidewall of the direct contact DC. The inner spacer 142 may include a portion in contact with the contact plug 150. The inner spacer 142 may be formed of or may include silicon nitride.

The intermediate spacer 146 may be placed between the inner spacer 142 and the outer spacer 148 in the first horizontal direction (X direction). The intermediate spacer 146 may have a sidewall facing the bit line BL with the inner spacer 142 therebetween, and a sidewall facing the contact plug 150, the metal silicide layer 152, and the landing pad LP with the outer spacer 148 therebetween. The intermediate spacer 146 may be formed of silicon oxide, an air spacer, or a combination thereof.

The outer spacer 148 may be in contact with sidewalls of each of the contact plug 150, the metal silicide layer 152, and the landing pad LP. The outer spacer 148 may be spaced apart from the inner spacer 142 with the intermediate spacer 146 therebetween. In some example embodiments, the outer spacer 148 may be made of or may include silicon nitride.

The spacer structure SP may extend parallel to the bit line BL in the second horizontal direction Y. The insulating capping pattern 136 and the spacer structure SP may constitute an insulating structure covering an upper surface and both sidewalls of the bit line BL.

A gap fill pattern 144 may be placed between the direct contact DC and the contact plug 150. The gap fill pattern 144 may be spaced apart from the direct contact DC with the inner spacer 142 therebetween. The gap fill pattern 144 may cover sidewalls of the direct contact DC and surround the direct contact DC. The gap fill pattern 144 may be in contact with the inner spacer 142 and the contact plug 150. In some example embodiments, the gap fill pattern 144 may be made of or include silicon nitride. The structure including the inner spacer 142 and the gap filling pattern 144 may be referred to as an insulating pattern IP.

Although not shown, a plurality of memristors and/or a plurality of capacitors may be arranged on the plurality of landing pads LP. The plurality of capacitors may include a plurality of lower electrodes, a capacitor dielectric layer, and an upper electrode. The capacitor dielectric layer may cover the plurality of lower electrodes. The upper electrode may cover the capacitor dielectric layer and may face the plurality of lower electrodes with the capacitor dielectric layer therebetween.

According to various example embodiments, a pad such as an additional pad 110 having a horizontal width that is greater than that of the active region ACT may be formed on an upper surface of the active region ACT. In addition, the additional pads 110 may be arranged to be spaced apart from each other at both ends of the bar-shaped active region ACT. Through the additional pad 110, a contact area between the active region ACT and the buried contact BC may be efficiently secured or may be more efficiently secured. For example, the contact area between the additional pad 110 electrically connected to the active region ACT and the contact plug 150 included the buried contact BC may be increased. An overall contact resistance may accordingly be decreased, and/or an overall electrical performance may be improved.

For example, the contact plug 150 may be formed by penetrating a first sidewall HORS of the additional pad 110. Accordingly, at least a portion of the first sidewall HORS contacting the contact plug 150 in the additional pad 110 may have a rounded (e.g., circular) shape, and a second sidewall 110LS not contacting the contact plug 150 in the additional pad 110 may have a vertical shape or a straight shape. Alternatively or additionally, as described above, an insulating pattern IP may be arranged to surround both sidewalls of the direct contact DC, and the insulating pattern IP may be in contact with the first sidewall HORS of the additional pad 110.

Hereinafter, for convenience of description, various example embodiments will be described with reference to FIG. 12B. In some example embodiments, the level of a lowermost surface 110B of the additional pad 110 may be located at substantially the same vertical level as the level of a lowermost surface DCB of the direct contact DC. A level of the lowermost surface 110B of an additional pad 110 such as a typical additional pad 110 may be lower than or below a level of the lowermost surface DCB of the direct contact DC. However, when the level of the lowermost surface DCB of the direct contact DC is low, the etched area of the buried insulating layer 120 for forming the direct contact hole DCH widens accordingly. When the etched area of the buried insulating layer 120 is widened, an insulating effect between the plurality of word lines 118 may be reduced. Alternatively or additionally, when the level of the lowermost surface DCB of the direct contact DC is low or deeper, the etched area of the device separator 112 for forming the direct contact hole DCH widens accordingly. When the etched area of the device separator 112 is widened, an insulation effect between the plurality of active regions ACT may be reduced. As illustrated in FIG. 12B, the level of the lowermost surface DCB of the direct contact DC is made to be substantially the same as the level of the lowermost surface 110B of the additional pad 110, thereby reducing or minimizing the etching areas of the buried insulating layer 120 and the device separator 112 to increase the insulation effect between the plurality of active regions ACT.

The buried contact BC may be formed on the additional pad 110. The buried contact BC may include the contact plug 150 that is in contact with the additional pad 110 at a lower portion thereof. A level of the lowermost surface 150B of the contact plug 150 may be higher than a level of the lowermost surface 110B of the additional pad 110 and may be lower than a level of the uppermost surface 110T of the additional pad 110. A level of the lowermost surface 150B of the contact plug 150 may be higher than or above a level of the uppermost surface ACTS of the active region ACT and lower than a level of the uppermost surface 112T of the device separator 112. Alternatively or additionally, the level of the lowermost surface 110B of the additional pad 110 may be substantially the same as the level of the uppermost surface ACTS of the active region ACT. For example, the contact plug 150 may not be in direct contact with the active region ACT, but may be electrically connected to the active region ACT through the additional pad 110.

Hereinafter, for convenience of description, various example embodiments will be described with reference to FIGS. 7 and 9. According to some example embodiments, at least a portion of the plurality of device separators 112 may have a step difference defined on a sidewall of each of the device separators 112 At least a portion of the plurality of device separators 112 may include a first portion P1 that is higher than a vertical level of the lowermost surface 110B of the additional pad 110, and a second portion P2 integrated with the first portion P1 and arranged under the first portion P1. In this case, a step difference may be defined between the sidewall of the first portion P1 and the sidewall of the second portion P2. As will be described later, the additional pad 110 may be formed by a negative etching technique on a plurality of recesses R1 and R2 (see FIGS. 7 and 9) formed by etching a portion of the device isolation layer 113. Therefore, in the process of forming multiple recesses R1 and R2, misalignment may occur between the plurality of recesses R1 and R2 and the active regions ACT. The misalignment may define a step difference between the sidewall of the first art P1 and the sidewall of the second portion P2.

Figure 7:
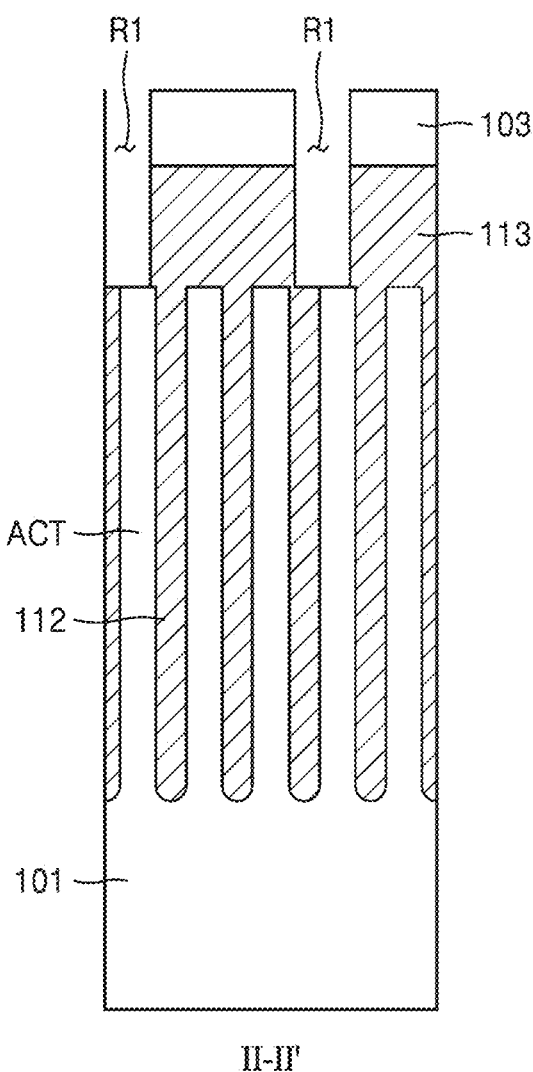
Figure 9:
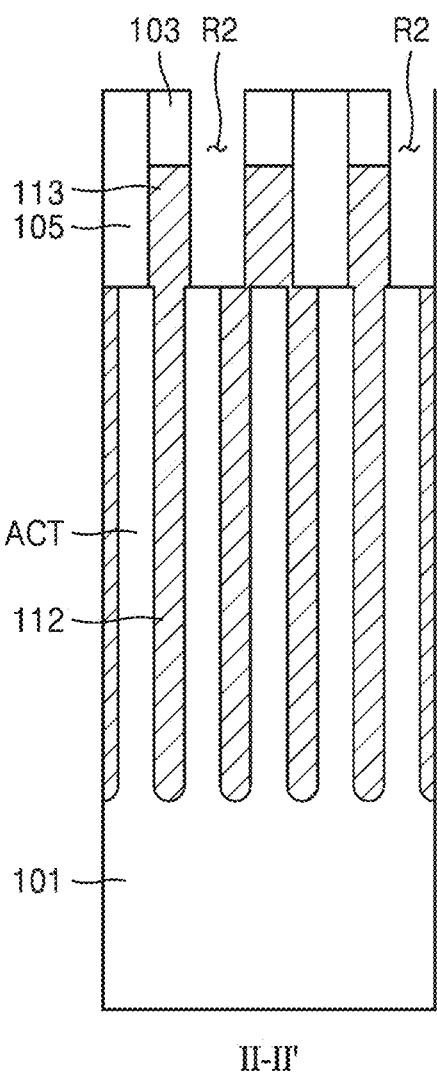

According to various example embodiments, the additional pad 110 may be formed by a negative etching method on the recesses R1, R2 formed by etching a portion of the device isolation layer 113 (see FIGS. 7 and 9). Accordingly, the second sidewall 110LS facing the first sidewall 110RS contacting the insulating pattern IP of the additional pad 110 may contact the device separator 112.

According to various example embodiment, the additional pad 110 may have a monolayer structure including doped polysilicon, e.g. including only polysilicon. Here, the contact plug 150 in contact with the additional pad 110 may be made of substantially the same material as the additional pad 110. However, example embodiments are not necessarily limited thereto, and the contact plug 150 may include a metal unlike the additional pad 110. In some example embodiments, the contact plug 150 may be in direct contact with the additional pad 110, and when the contact plug 150 and the additional pad 110 are formed of the same material, the contact resistance between the contact plug 150 and the additional pad 110 may be very low.

Ultimately, the integrated circuit device 10 according to various example embodiments includes an additional pad 110 formed on the active region ACT to secure or to help to secure a contact area between the buried contact BC and the active region ACT, thereby maintaining or helping to maintain production efficiency and/or more stable operating performance.

As shown in FIG. 2, the distance between the lowermost surface of the buried insulating layer 120 formed on the word line 118 and the lowermost surface of the additional pad 110 may be defined as a first distance h1. A distance between the lowermost surface of the buried insulating layer 120 and the lowermost surface of the direct contact DC may be defined as a second distance h2. In this case, the first distance h1 and the second distance h2 may be substantially the same. The direct contact hole DCH may be formed so that the level of the lowermost surface of the direct contact hole DCH (hereinafter see FIG. 12B) for forming the direct contact DC is located at a vertical level that is substantially the same as the level of the lowermost surface of the additional pad 110. Therefore, the first distance h1 between the lowermost surface of the buried insulation layer 120 and the lowermost surface of the additional pad 110 may be substantially the same as the second distance h2 between the lowermost surface of the buried insulation layer 120 and the lowermost surface of the direct contact DC. Alternatively or additionally, the distance between the lowermost surface of the buried insulating layer 120 and the uppermost surface of the active region ACT may be substantially the same as the first distance h1 between the lowermost surface of the buried insulating layer 120 and the lowermost surface of the additional pad 110. Therefore, the distance between the lowermost surface of the buried insulating layer 120 and the uppermost surface of the active region ACT may be substantially the same as the second distance h2 between the lowermost surface of the buried insulating layer 120 and the lowermost surface of the direct contact DC.

Since the vertical level of the lowermost surface of the direct contact DC and the vertical level of the lowermost surface of the additional pad 110 are made to be substantially the same, etching (e.g., inadvertent etching) of the buried insulating layer 120 made of an insulating material may be minimized or reduced in likelihood of occurrence. By reducing inadvertent etching of the buried insulating layer 120 made of an insulating material, an insulation effect between the plurality of word lines 118 may be increased.

Figure 4:
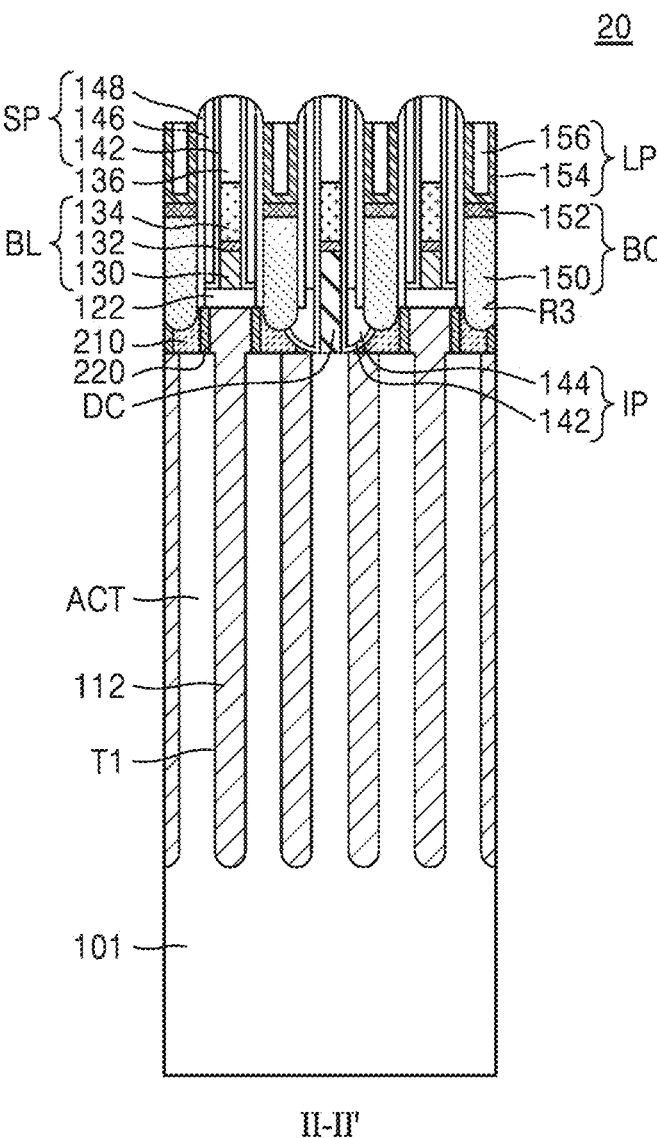
FIG. 4 is a cross-sectional view illustrating an integrated circuit device according to various example embodiments.

FIG. 4 is a cross-sectional view illustrating an integrated circuit device 20 according to various example embodiments.

The integrated circuit device 20 shown in FIG. 4 may be substantially similar or identical to the integrated circuit device 10 shown in FIG. 2 except that an additional spacer 220 formed on both sidewalls of an additional pad 210 is further included when compared to the integrated circuit device 10 shown in FIG. 2. Therefore, the redundant description of the same components as those of the integrated circuit device 10 shown in FIG. 2 will be omitted or simplified.

Referring to FIG. 4, the integrated circuit device 20 may include the additional pad 210 arranged on an upper portion of an active region ACT and the additional spacer 220 formed on either sidewall of the additional pad 210. Accordingly, the contact plug 150 may be formed by penetrating one sidewall of the additional pad 210 and a portion of the additional spacer 220.

For example, at least a portion of the one sidewall or upper surface of the additional pad 210 may have a rounded (e.g., circular or partly circular) shape or rounded profile, and one sidewall or upper surface of the additional spacer 220 contacting the one sidewall of the additional pad 210 may have a rounded shape. In addition, the other sidewall facing the one sidewall in the additional pad 210 may have a vertical shape or vertical profile or linear profile, and the one sidewall or upper surface of the additional spacer 220 in contact with the other sidewall of the additional pad 210 may have a rounded shape or rounded profile.

In some example embodiments, the insulating pattern IP surrounding both sidewalls of the direct contact DC may contact one sidewall of the additional pad 210 and one sidewall of the additional spacer 220. In addition, the vertical level of the lower surface of the contact plug 150 placed under the buried contact BC may be higher than or above the vertical levels of the lowermost surfaces of the additional pad 210 and the additional spacer 220, and may be lower than or below the vertical levels of the uppermost surfaces of the additional pad 210 and the additional spacer 220. For example, the contact plug 150 may not be in direct contact with the active region ACT, but may be electrically connected to the active region ACT through the additional pad 210.

FIGS. 5A to 12B are views illustrating a process order to explain a method of manufacturing an integrated circuit device in accordance with some example embodiments. Specifically, FIGS. 5A, 6A, 7A, and 12A are cross-sectional views according to positions taken along the line I-I' of FIG. 1. FIGS. 5B, 6B, 7, 8, 9, 10, 11B, and 12B are cross-sectional views taken along line II-II' of FIG. 1.

Figure 5A:
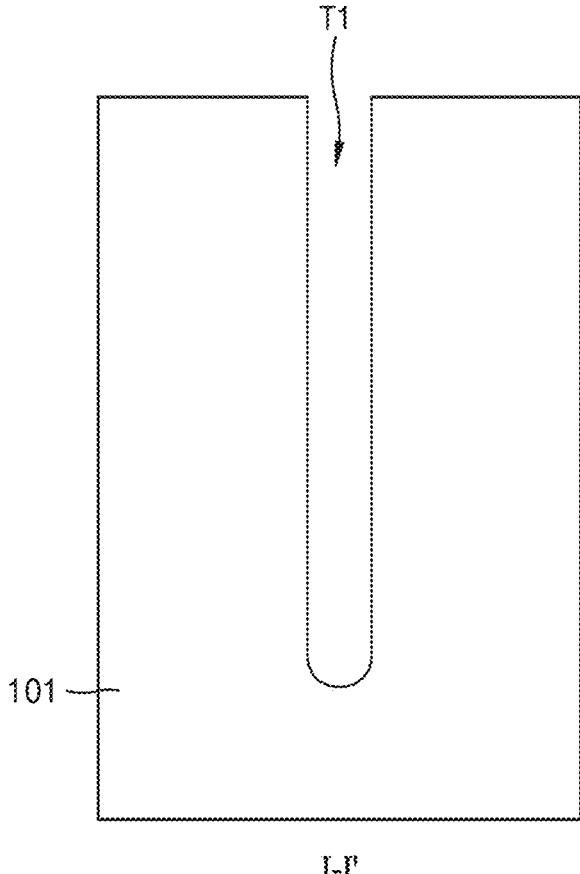
FIGS. 5A to 12B are views illustrating a process order to explain a method of manufacturing an integrated circuit device in accordance with some example embodiments.
Figure 5B:
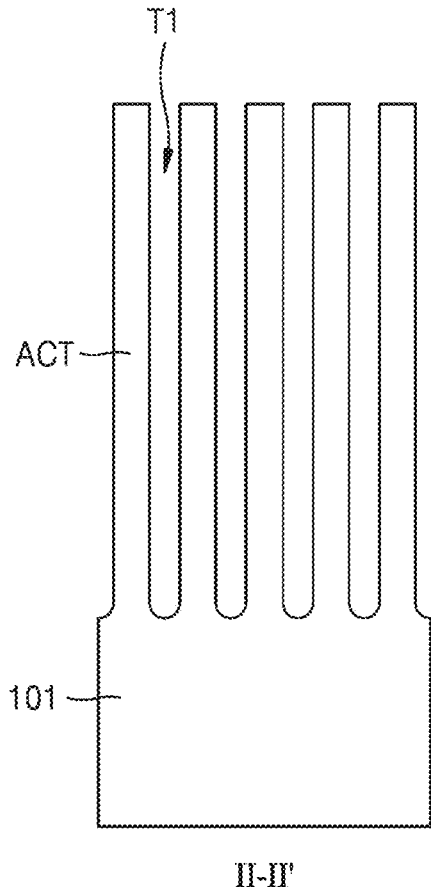

Referring to FIGS. 5A and 5B, a first trench T1 is formed in a substrate 101, e.g. by etching the substrate 101. Although the width of the first trench T1 is illustrated in a certain shape at the upper and lower portions thereof, the width of the first trench T1 may narrow toward the lower portion thereof due to the characteristics of the dry etching process. Accordingly, the sidewall of the first trench T1 is not vertical, but may have a tapered shape having a fine inclination.

Figure 6A:
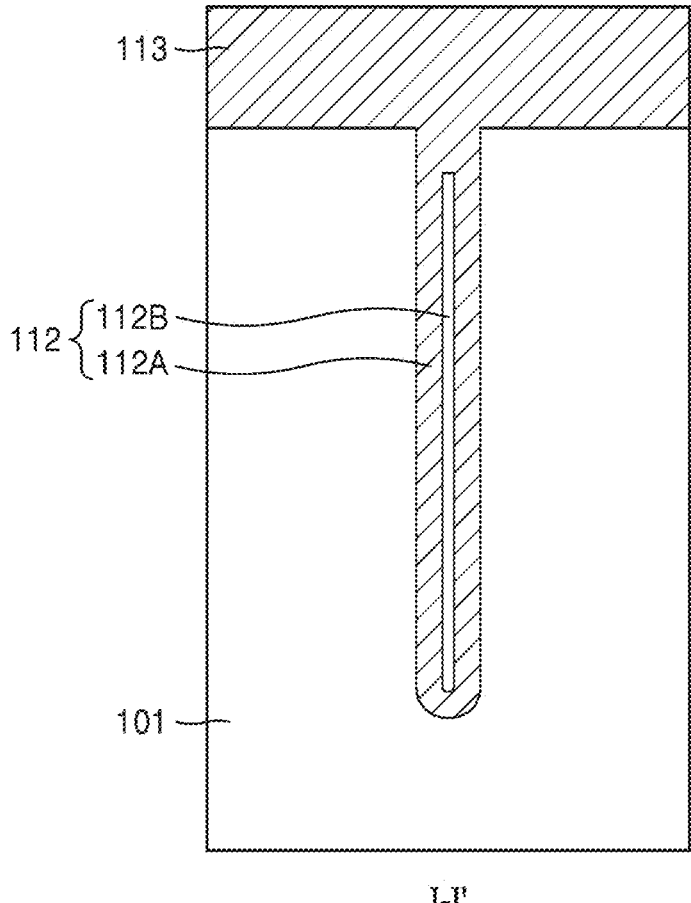
Figure 6B:
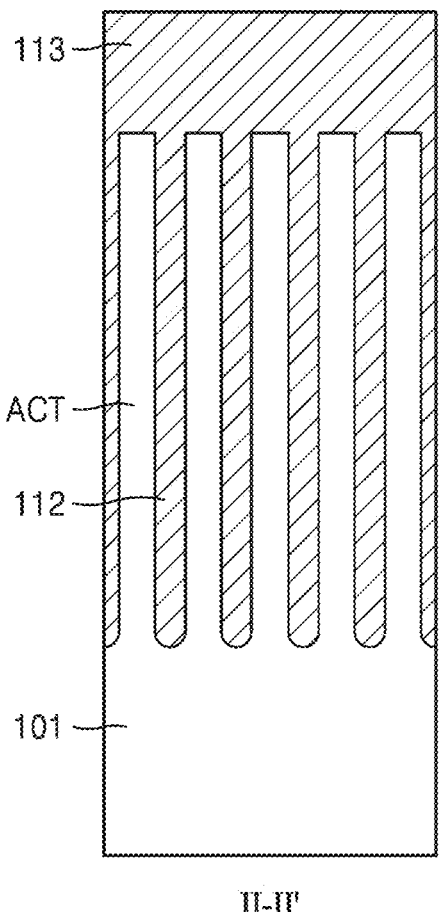

Referring to FIGS. 6A and 6B, the first trench T1 (see FIG. 5B) is filled with an insulating material to form a device separator 112, e.g. by a deposition process such as a shallow trench isolation (STI) deposition process and/or by a spin-on glass process.

The device separator 112 may have a different structure depending on the horizontal width of the first trench T1 (see FIG. 5B). For example, the device separator 112 may have a first structure having a single insulating layer. In addition, the device separator 112 may have a second structure including a first insulating layer 112A and a second insulating layer 112B. In some example embodiments, the second insulating layer 112B may be a seam and/or an air gap; example embodiments are not limited thereto.

A device isolation layer 113 integrated with the device separator 112 may be formed on the device separator 112. The device isolation layer 113 may be made of the same insulating material as the device separator 112 and/or may be formed at the same time as the device separator 112. The device isolation layer 113 may cover the upper surfaces of the active regions ACT.

Referring to FIG. 7, a first sacrificial layer 103 may be formed on the device isolation layer 113. The first sacrificial layer 103 may be formed of an insulating material. For example, the first sacrificial layer 103 may be composed of SiN, SiO, SiON, SiOC, and a metal oxide or a combination thereof. The first sacrificial layer 103 may be formed of a material having an etching selectivity different from that of the device isolation layer 113.

After forming a mask pattern such as a hard-mask pattern and/or a soft-mask pattern (not shown) on the first sacrificial layer 103, a first recess R1 may be formed by etching the first sacrificial layer 103 and the device separator 113 using the mask pattern as an etching mask. Although the width of the first recess R1 is illustrated in a certain shape at the upper and lower portions thereof, the width of the first recess R1 may narrow toward the lower portion thereof due to the characteristics of the dry etching process. Accordingly, the sidewall of the first recess R1 may not be vertical, but may have a tapered shape having a fine inclination. The first recess R1 may pass through the first sacrificial layer 103 and the device isolation layer 113 and formed toward the upper surface of the active region ACT.

Figure 8:
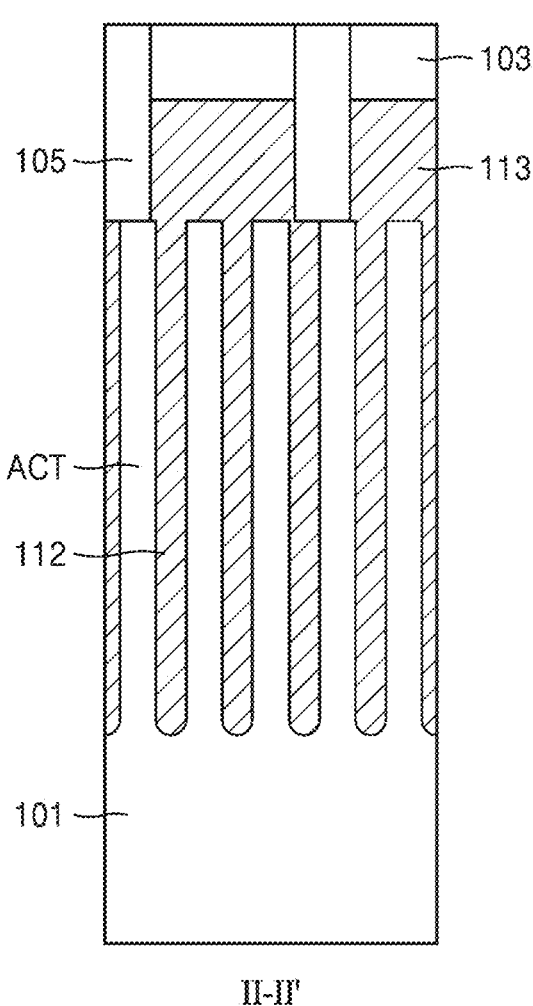

Referring to FIGS. 8 and 9, a second sacrificial layer 105 may be formed in the first recess R1 formed by etching the first sacrificial layer 103 and the device separator 113. The second sacrificial layer 105 may be formed of or may include the same material as the first sacrificial layer 103.

After forming mask patterns (not shown) on the first sacrificial layer 103 and the second sacrificial layer 105, the first sacrificial layer 103 and the device separator 113 may be re-etched using the mask patterns as etching masks to form second recesses R2. Although the width of the second recess R2 is illustrated in a certain shape at the upper and lower portions thereof, the width of the second recess R2 may narrow toward the lower portion thereof due to the characteristics of the dry etching process. Accordingly, the sidewall of the second recess R2 is not vertical, but may have a tapered shape having a fine inclination.

Figure 10:
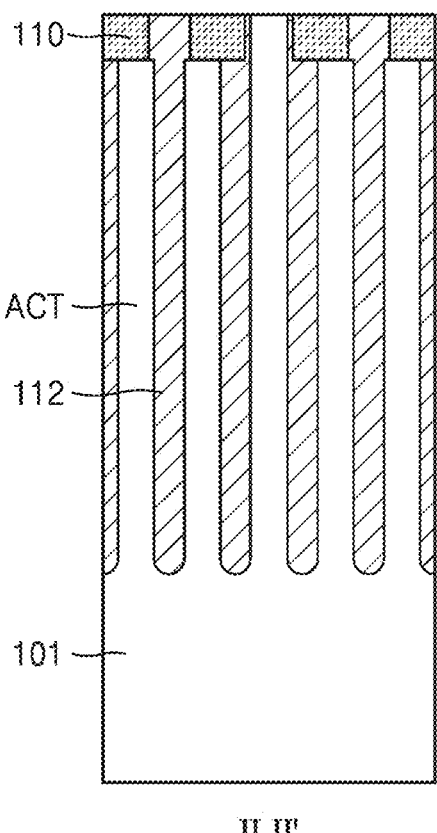

Referring to FIG. 10, after removing the first sacrificial layer 103 and the second sacrificial layer 105, additional pads 110 may be formed in the first recess R1 and the second recess R2. In some example embodiments, the additional pad 110 may include doped polysilicon, e.g. may be deposited as doped polysilicon and/or deposited and implanted as doped polysilicon. At the bottom portions of the first recess R1 and the second recess R2, the bottom surface of the additional pad 110 may be in contact with the upper surface of the active region ACT. In the drawings, the width of the additional pad 110 is shown in a constant shape at the upper and lower portions thereof. However, since the second recess R2 and the second sacrificial layer 105 may have a tapered shape, the additional pad 110 may also have a tapered shape having a width that decreases toward the lower portion thereof.

Figure 11A:
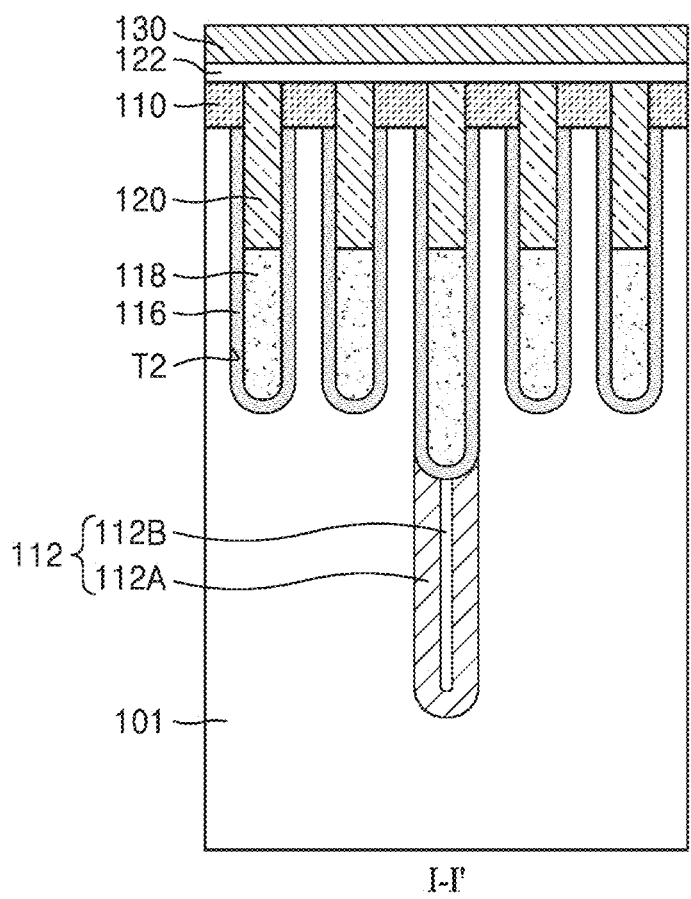
Figure 11B:
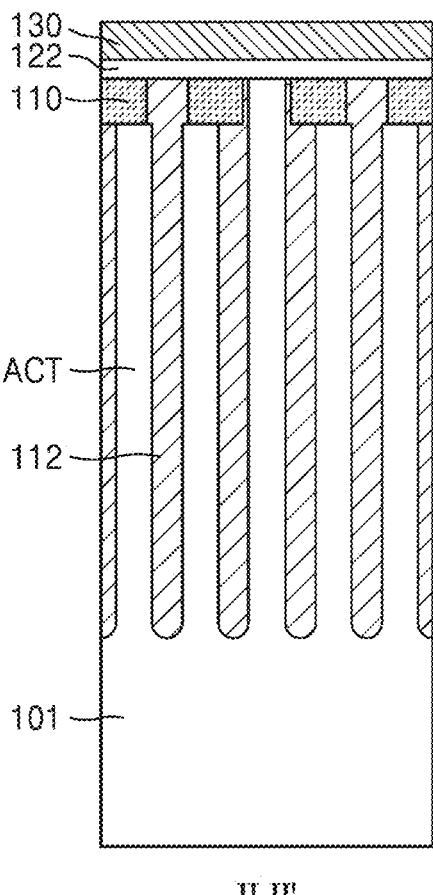

Referring to FIGS. 11A and 11B, a plurality of second trenches T2 may be formed in the substrate 101.

The second trench T2 may extend in the first horizontal direction (X direction) in parallel with each other and may be formed across the active region ACT. After cleaning a resultant product on the substrate 101 in which the second trench T2 is formed, a gate dielectric layer 116, a word line 118, and a buried insulating layer 120 are sequentially formed inside the second trench T2.

For example, after the second trench T2 is formed, a gate dielectric layer 116 is formed on the whole surface of the substrate 101. The gate dielectric layer 116 may be deposited and/or may be formed through a thermal and/or plasma process such as through a thermal oxidation process. Accordingly, the gate dielectric layer 116 may cover the inner wall of the second trench T2. The gate dielectric layer 116 may be formed of, for example, at least one material selected from silicon oxide, silicon nitride, silicon oxynitride, oxide/nitride/oxide (ONO), and high-k dielectric layer having a dielectric constant higher than silicon oxide.

After the gate dielectric layer 116 is formed, a word line 118 having a buried structure may be formed by filling a lower portion of the second trench T2 with a conductive layer. In some example embodiments, the upper surface of the word line 118 may be lower than the upper surface of the substrate 101 or the upper surface of the active region ACT. The word line 118 may be formed of, for example, at least one material selected from Ti, TiN, Ta, TaN, W, WN, TiSiN, and WSiN.

After the word line 118 is formed, an upper portion of the second trench T2 is filled with an insulating material to form a buried insulating layer 120. Accordingly, the buried insulating layer 120 may be formed on the word line 118 in the second trench T2.

Thereafter, the buffer layer 122 and the lower conductive layer 130 are sequentially formed on the whole surface of the substrate 101.

The buffer layer 122 may be formed to cover the upper surfaces of the plurality of additional pads 110, the upper surfaces of the device separators 112, and the upper surfaces of the plurality of buried insulation layers 120. To form the buffer layer 122, a first silicon oxide, a silicon nitride, and a second silicon oxide may be sequentially formed on the substrate 101, but embodiments are not limited thereto.

The lower conductive layer 130 may be formed on the buffer layer 122. The lower conductive layer 130 may be formed of doped polysilicon, but is not limited thereto.

Figure 12A:
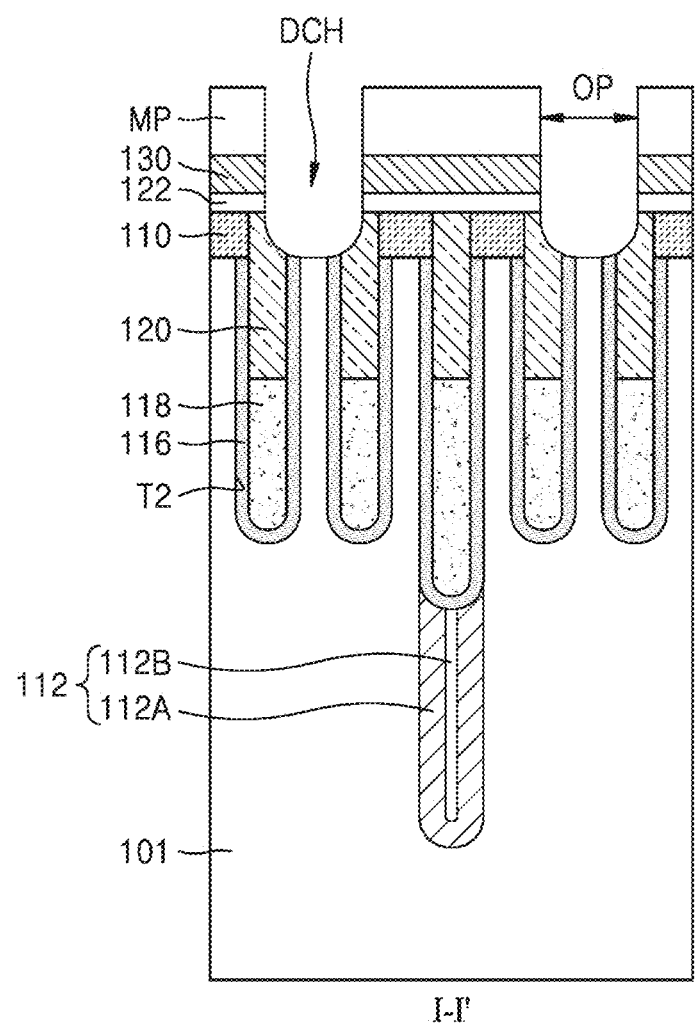
Figure 12B:
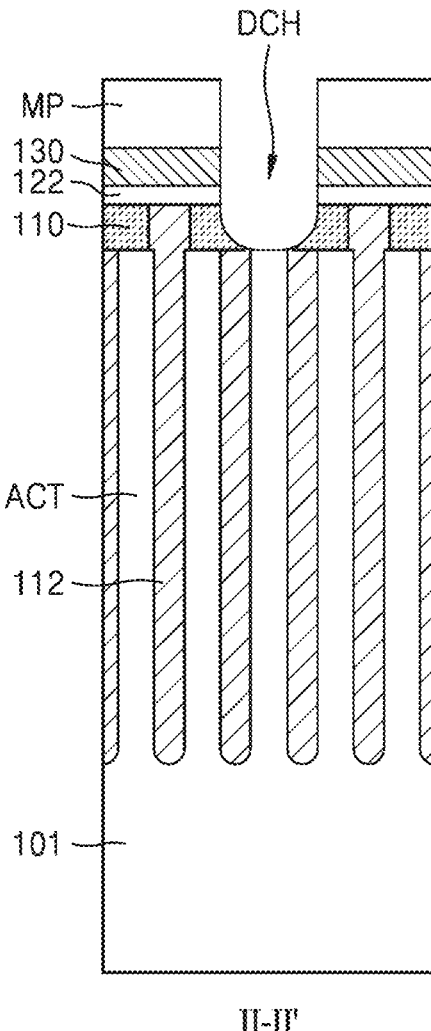

Referring to FIGS. 12A and 12B, a mask pattern MP is formed on the lower conductive layer 130 by a photolithography process.

The mask pattern MP may be formed of a material that may be easily removed, e.g. through an ashing and strip process. For example, the mask pattern MP may be formed of a photoresist or a material having a high carbon content such as a spin-on hard (SOH) mask.

The mask pattern MP may include an open region OP exposing a portion corresponding to a central portion of the active region ACT. A central portion of the active region ACT exposed through the open region OP may correspond to a portion where the direct contact DC (see FIG. 2) is to be formed.

A portion of each of the lower conductive layer 130, the lower substrate 101, the device separator 112, the gate dielectric layer 116, and the additional pad 110 exposed through the open region OP may be etched using the mask pattern MP as an etch mask to form a direct contact hole DCH exposing the active region ACT of the substrate 101.

Meanwhile, depending on the shape of the open area of the mask pattern MP, the shape of the direct contact hole DCH and the shape of the additional pad 110 may be variously changed. For example, since a portion of the sidewall of the additional pad 110 may be removed by the direct contact hole DCH, the shape of the additional pad 110 may be defined by the direct contact hole DCH.

As illustrated in FIGS. 12A and 12B, the level of the lowermost surface of the additional pad 110 may be located at substantially the same vertical level as the level of the lowermost surface of the direct contact hole DCH. A level of the lowermost surface 110B of a typical additional pad 110 may be lower than a level of the lowermost surface DCB of the direct contact DC. However, when the level of the lowermost surface DCB of the direct contact DC is low, the etched area of the buried insulating layer 120 for forming the direct contact hole DCH widens accordingly. When the etched area of the buried insulating layer 120 is widened, an insulating effect between the plurality of word lines 118 may be reduced. In addition, when the level of the lowermost surface DCB of the direct contact DC is low, the etched area of the device separator 112 for forming the direct contact hole DCH widens accordingly. When the etched area of the device separator 112 is widened, an insulation effect between the plurality of active regions ACT may be reduced. Since the level of the lowermost surface DCB of the direct contact DC is made to be substantially the same as the level of the lowermost surface 110B of the additional pad 110, etching regions of the buried insulation layer 120 and the device separator 112 may be reduced or minimized to increase an insulation effect between the plurality of active regions ACT.

Figure 13:
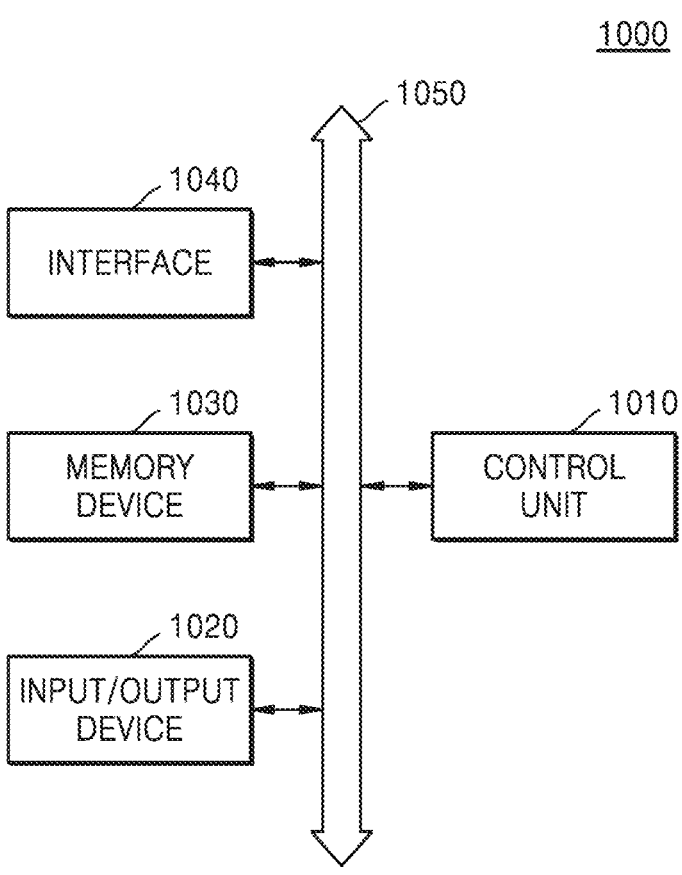
FIG. 13 is a block diagram illustrating a system including an integrated circuit device according to some example embodiments.

FIG. 13 is a block diagram illustrating a system including an integrated circuit device according to some example embodiments.

Referring to FIG. 13, a system 1000 includes a control unit 1010, an input/output device 1020, a memory device 1030, an interface 1040, and a bus 1050.

The system 1000 may be a mobile system or a system for transmitting or receiving information. In some example embodiments, the mobile system may be a portable computer, a web tablet, a mobile phone, a digital music player, or a memory card.

The control unit 1010 is for controlling an execution program in the system 1000 and may include a microprocessor, a digital signal processor, a microcontroller, or a similar device.

The input/output device 1020 may be used to input or output data of the system 1000. The system 1000 may be connected to an external device, for example, a personal computer or network, using the input/output device 1020, and may exchange data with the external device. The input/output device 1020 may be, for example, a touch screen, a touch pad, a keyboard, or a display.

The memory device 1030 may store data for the operation of the control unit 1010 or may store data processed by the control unit 1010. The memory device 1030 may include any one of the integrated circuit devices 10, 20, and 30 according to various example embodiments described above.

The interface 1040 may be a data transmission path between the system 1000 and an external device. The control unit 1010, the input/output device 1020, the memory device 1030, and the interface 1040 may communicate with each other through the bus 1050.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While example embodiments have been particularly shown and described with reference to descriptions thereof, it will be understood that various changes in form and details may be made therein without departing from the spirit and scope of the following claims. Furthermore, example embodiments are not necessarily mutually exclusive with one another. For example, some example embodiments may include one or more features described with reference to one or more figures and may also include one or more other features described with reference to one or more other figures.

What is claimed is:

1. An integrated circuit device comprising:
a substrate including an active region defined by a plurality of device separation regions;
a word line on the substrate and arranged in a word line trench that extends in a first horizontal direction;
a bit line on the word line and extending in a second horizontal direction orthogonal to the first horizontal direction;
a pad on the active region and having a horizontal width that is larger than the active region; and
a bit line contact electrically connecting the bit line to the active region,
wherein a lowermost surface of the pad is at a same vertical level as a lowermost surface of the bit line contact.

2. The integrated circuit device of claim 1, wherein a lowermost surface of the pad is at a same vertical level as an uppermost surface of the active region.

3. The integrated circuit device of claim 1, wherein at least a portion of one sidewall in the pad has a rounded profile, and another sidewall facing the one sidewall in the pad has a linear profile.

4. The integrated circuit device of claim 1, wherein at least a portion of an upper surface of the active region is in contact with the device separation regions.

5. The integrated circuit device of claim 1, wherein
at least a portion of the plurality of device separation regions comprises a first portion that is above a lowermost surface of the pad, and a second portion integral with the first portion and under the first portion, and
a step is defined on a sidewall of the first portion and a sidewall of the second portion.

6. The integrated circuit device of claim 1, wherein the pad has a monolayer structure including doped polysilicon.

7. The integrated circuit device of claim 1, wherein
the active region has a bar shape extending in an oblique direction with respect to the first and second horizontal directions, and
the pad is spaced apart from both ends of the bar shape.

8. The integrated circuit device of claim 1, further comprising:
an insulating pattern surrounding first and second sidewalls of the bit line contact, wherein
the insulating pattern is in contact with one sidewall of the pad.

9. The integrated circuit device of claim 8, wherein, in the pad, another sidewall facing one sidewall of the pad is in contact with the device separation regions.

10. The integrated circuit device of claim 1, further comprising:
a buried contact on the pad, wherein
a lowermost surface of the buried contact is above the lowermost surface of the pad and below an uppermost surface of the pad.

11. The integrated circuit device of claim 10, wherein the lowermost surface of the buried contact is above the uppermost surface of the active region and below an uppermost surface of the device separation regions.

12. An integrated circuit device comprising:
a substrate including an active region defined by a plurality of device separation regions;
a word line on the substrate and arranged in a word line trench extending in a first horizontal direction;
a bit line on the word line and extending in a second horizontal direction orthogonal to the first horizontal direction;
a pad on the active region and having a horizontal width that is larger than the active region;
a bit line contact electrically connecting the bit line to the active region; and
a buried insulating layer on the word line and in the word line trench,
wherein a distance between a lowermost surface of the buried insulating layer and a lowermost surface of the pad is same as a distance between the lowermost surface of the buried insulating layer and a lowermost surface of the bit line contact.

13. The integrated circuit device of claim 12, wherein a distance between the lowermost surface of the buried insulating layer and a lowermost surface of the pad is same as a distance between the lowermost surface of the buried insulating layer and an uppermost surface of the active region.

14. The integrated circuit device of claim 12, further comprising:
a buried contact on the pad, wherein
a lowermost surface of the buried contact is above the lowermost surface of the pad and below an uppermost surface of the pad.

15. The integrated circuit device of claim 14, further comprising
a spacer on first and second sidewalls of the pad, wherein
the lowermost surface of the buried contact is above the lowermost surface of the spacer and below an uppermost surface of the spacer.

16. The integrated circuit device of claim 15, further comprising an insulating pattern surrounding a first sidewall and a second sidewall of the bit line contact, wherein the insulating pattern is in contact with one sidewall of the pad and one sidewall of the spacer.

17. The integrated circuit device of claim 12, wherein at least a portion of the plurality of device separation regions comprises a first portion above a lowermost surface of the pad, and a second portion integral with the first portion and under the first portion, and a step is defined on a sidewall of the first portion and a sidewall of the second portion.

18. The integrated circuit device of claim 12, wherein the pad has a monolayer structure including doped polysilicon.

19. An integrated circuit device comprising:

a substrate including an active region defined by a plurality of device separation regions;

a word line on the substrate and arranged in a word line trench that extends in a first horizontal direction;

a bit line on the word line and extending in a second horizontal direction orthogonal to the first horizontal direction;

a pad of a monolayer structure including doped polysilicon, which is on the active region and has a horizontal width that is larger than the active region; and a bit line contact electrically connecting the bit line to the active region, wherein at least a portion of an upper surface of the active region contacts the device separation regions, a lowermost surface of the pad is at a same vertical level as a lowermost surface of the bit line contact and of an uppermost surface of the active region, and at least a portion of one sidewall in the pad has a rounded profile, and another sidewall facing the one sidewall in the pad has a linear profile.

20. The integrated circuit device of claim 19, further comprising:

an insulating pattern surrounding a first sidewall and a second sidewall of the bit line contact, and the insulating pattern contacting one sidewall of the pad; and a buried contact on the pad, wherein a lowermost surface of the buried contact is above the lowermost surface of the pad, is below an uppermost surface of the pad, is above the uppermost surface of the active region, and is below an uppermost surface of the device separation regions, and in the pad, another sidewall facing one sidewall of the pad is in contact with the device separation regions.

* * * * *